(12) United States Patent
Khiang

(10) Patent No.: US 7,443,041 B2
(45) Date of Patent: Oct. 28, 2008

(54) PACKAGING OF A MICROCHIP DEVICE

(75) Inventor: Wang Chuen Khiang, Singapore (SG)

(73) Assignee: United Test & Assembly Center Limited, Singapore (SG)

( * ) Notice: Subject to any disclaimer, the term of this patent is extended or adjusted under 35 U.S.C. 154(b) by 630 days.

(21) Appl. No.: 10/312,589

(22) PCT Filed: Jun. 19, 2002

(86) PCT No.: PCT/SG02/00125

§ 371 (c)(1),
(2), (4) Date: May 19, 2004

(87) PCT Pub. No.: WO04/002003

PCT Pub. Date: Dec. 31, 2003

(65) Prior Publication Data

US 2005/0257955 A1     Nov. 24, 2005

(51) Int. Cl.
| | |
|---|---|
| H01L 23/52 | (2006.01) |
| H01L 23/48 | (2006.01) |
| H01L 23/40 | (2006.01) |
| H01L 23/485 | (2006.01) |
| H01L 23/498 | (2006.01) |
| H01L 21/50 | (2006.01) |
| H01L 21/48 | (2006.01) |
| H01L 21/44 | (2006.01) |

(52) U.S. Cl. .................. 257/784; 257/782; 257/783; 257/780; 257/781; 257/737; 257/738; 257/E23.021; 257/E23.069; 438/106; 438/107; 438/110; 438/125; 438/126; 438/127

(58) Field of Classification Search .................. 257/737, 257/738, 780–784, E23.021, E23.069; 438/106, 438/107, 110, 125–127
See application file for complete search history.

(56) References Cited

U.S. PATENT DOCUMENTS

| | | | |
|---|---|---|---|
| 4,868,349 A | 9/1989 | Chia | |
| 5,126,824 A | 6/1992 | Ueda | |
| 5,554,885 A | 9/1996 | Yamasaki et al. | |
| 5,777,391 A | * 7/1998 | Nakamura et al. | .......... 257/778 |
| 5,818,698 A | * 10/1998 | Corisis | .......... 361/760 |

(Continued)

FOREIGN PATENT DOCUMENTS

DE   10116069   10/2002

(Continued)

OTHER PUBLICATIONS

English language Abstract of JP 2000-208540.

(Continued)

*Primary Examiner*—Luan Thai
(74) *Attorney, Agent, or Firm*—Greenblum & Bernstein, P.L.C.

(57) ABSTRACT

A method of packaging a microchip device, an interposer for packaging, and a packaged microchip device. An interposer is placed on microchip devices. The interposer includes an aperture which extends from the interposer surface where external electrical contacts are located on the surface of the microchip devices. Electrical contacts on the microchip device surface are accessible through the aperture in order to electrically connect the electrical contacts with the external electrical contacts of the interposer. The aperture is divided into at least two openings or aperture regions, separated by a bridge. This facilitates the handling of the interposer.

4 Claims, 3 Drawing Sheets

U.S. PATENT DOCUMENTS

| | | | |
|---|---|---|---|
| 6,091,140 A * | 7/2000 | Toh et al. | 257/691 |
| 6,133,627 A | 10/2000 | Khandros et al. | |
| 6,144,102 A * | 11/2000 | Amagai | 257/781 |
| 6,177,723 B1 * | 1/2001 | Eng et al. | 257/691 |
| 6,242,283 B1 * | 6/2001 | Lo et al. | 438/106 |
| 6,268,650 B1 * | 7/2001 | Kinsman et al. | 257/691 |
| 6,300,165 B2 * | 10/2001 | Castro | 438/118 |
| 6,331,737 B1 | 12/2001 | Lim et al. | |
| 6,372,552 B1 | 4/2002 | Kinsman et al. | |
| 6,376,916 B1 | 4/2002 | Hosono et al. | |
| 6,385,049 B1 * | 5/2002 | Chia-Yu et al. | 361/721 |
| 6,476,507 B1 * | 11/2002 | Takehara | 257/787 |
| 6,522,018 B1 * | 2/2003 | Tay et al. | 257/780 |
| 6,531,335 B1 * | 3/2003 | Grigg | 438/106 |
| 6,548,764 B1 * | 4/2003 | Prindiville et al. | 174/255 |
| 6,589,820 B1 * | 7/2003 | Bolken | 438/127 |
| 6,781,248 B2 * | 8/2004 | Hui et al. | 257/787 |
| 6,906,928 B2 * | 6/2005 | Hauser et al. | 361/764 |
| 2002/0050654 A1 | 5/2002 | Bolken | |
| 2002/0149917 A1 | 10/2002 | Hauser et al. | |
| 2004/0175866 A1 | 9/2004 | Woerz et al. | |

FOREIGN PATENT DOCUMENTS

| | | |
|---|---|---|
| DE | 10127009 | 12/2002 |
| JP | 2-017665 | 1/1990 |
| JP | 8-306817 | 11/1996 |
| JP | 2000-208540 | 7/2000 |
| JP | 2000-260791 | 9/2000 |
| JP | 2003-234436 | 8/2003 |

OTHER PUBLICATIONS

English language Abstract of JP 2000-260791.
English language Abstract of DE 10127009.
English language Abstract of JP 8-306817.
English language Abstract of JP 2-017665.
English language Abstract of JP 2003-234436.

* cited by examiner

PACKAGING OF A MICROCHIP DEVICE

This invention relates generally to the field of semiconductor device manufacture and more particularly to the packaging of microchip devices with integrated circuit chips to be used in an electronic assembly, such as a printed circuit board.

In the electronics industry, the quest for smaller electronic devices which perform better at a lower cost is ongoing. This is especially true for the portable electronics and wireless communications sector which has undergone recent rapid growth. In particular, as a result of the decreasing size of microchips and the increasing density of electronic functions per chip area, there is a strong demand for very small microchip packages.

Examples for conventional packaging of microchip devices are thin small outline package (TSOP) and quad flat pack package (QFP). These packages have fixed package sizes with respect to the number of external electrical contacts for contacting the packed microchip device with its periphery.

With reduced sizes of microchips, the technical requirements for microchip packaging have also been increased. In particular, the electrical signal path length should be as short as possible to avoid delay in the transportation of high speed electrical signals.

Usually, the microchip device comprises very small electrical pads located on the surface of the microchip. It is known to connect these electrical pads with the external contacts of the package using very small wires ("wire bonding") or ribbons (e.g. tape automatic bonding, TAB). In both cases these conductors are very-delicate and should be protected against mechanical defects. Further, it is known to provide external electrical contacts in the shape of pins or balls so as to allow electrical contact to be made to the packaged microchip from the outside of package.

In certain packaging systems, the electrical pads are contacts on the microchip surface arranged in a certain layout and thereby adapted to a specific packaging method. A class of packaging methods which covers such techniques is called Chip Size Packaging (CSP). According to the definition of CSP as given by the Institute for Interconnecting and Packaging Electronic Circuits (IPC) the resulting package surface area is not greater than 1.5 times the microchip surface area. Further, the resulting package can easily be contacted via exposed external contacts on the package surface.

In a new subclass of CSP, an interposer with a plurality of external contacts is used for packaging. The external contacts are located on an outer side of the interposer which has an aperture extending from the outer side through the interposer. In particular, the aperture has the shape of a window or frame (window chip scale packaging, wCSP), but it may also be open on one or more than one of its lateral sides. The interposer is arranged adjacent or in the vicinity of the microchip device so that the electrical contacts on the microchip surface are accessible from the outer side through the aperture. After that, the contacts on the microchip surface are electrically connected with the external contacts on the outer side of the interposer using electrical conductors. At least some of the conductors will extend within the aperture and will be encapsulated afterwards by an electrically insulating material. This new subclass of CSP has the following advantages:

The conductor length for connecting the electrical contacts on the microchip surface with the external contacts can be kept very short, especially if the edge of the aperture is located close to the contacts on the microchip device surface.

The external contacts on the outside of the interposer will be connected from the same side as the contacts on the microchip surface during the connecting process. Therefore, the arrangement can be very compact.

The conductors are protected by the encapsulating material.

The external contacts of the package can directly be connected to contacts of a board. Further, the microchip device is located on or near the opposite surface of the package so as to allow the maximum possible heat dissipation to the ambient.

However, the positioning of the interposer relative to the microchip device must be performed very precisely. Otherwise, very little deviations from the desired position may result in contact failure and/or damage the conductors. Further, if transfer moulding is used for encapsulating the conductors with electrically insulating material, the handling of the interposer and the microchip device in order to prepare the transfer moulding may result in contact failure or damaging.

It is an object of the present invention to provide a method of packaging a microchip device which facilitates the handling of the microchip device and/or the interposer and/or the packaged microchip device and allows for small reject rates in mass production.

It is a further object of the invention to provide a corresponding interposer and a corresponding packaged microchip device.

Accordingly, the following method of packaging a microchip device is proposed. The method comprises:

providing a microchip device having a plurality of first electrical contacts;

providing an interposer with a plurality of second electrical contacts on an outer side of the interposer and with an aperture extending from the outer side through the interposer, wherein the aperture is divided into at least two openings by a bridge which connects opposite aperture edges;

arranging the interposer adjacent to the microchip device so that the first electrical contacts are accessible from the outer side through at least a first of the openings; and making electrical connections between respective ones of the first electrical contacts and the second electrical contacts.

This solution facilitates the handling of the interposer and of the microchip device, since the bridge strengthens the interposer in the region of the aperture. At least in the region next to the bridge, the dimensions of the at least two openings are stable and do not depend on the handling of the interposer. Especially if both openings are used to connect the first electrical contacts with the second electrical contacts, the stability is significantly higher compared to a non-divided aperture with the same or a similar cross-sectional area or dimensions. Also, the dimensions of the second electrical contacts on the outer side of the interposer are kept stable. Therefore, the failure rate for contacting a packaged microchip device to external devices, such as electrical boards, can be decreased.

Preferably, the bridge is located as near as possible to the first electrical contacts. Therefore, in a preferred embodiment, wherein the first opening defines a connecting area to be used for locating the electrical conductors, the bridge and the nearest one of the electrical conductors in the connecting area are located so that their distance is smaller than 3 times, preferably 2 times, the average distance between the conductors in the connecting area.

Preferably, after the contacting of the first electrical contacts, at least the first opening is filled with electrically insulating material by transfer moulding.

In a preferred embodiment, at least one of the electrical conductors is connected so as to extend from the microchip device through the first opening and to further extend outside the opening on the outer side of the interposer. In this embodiment, the conductor is encapsulated at least outside the opening with insulating material by transfer moulding. During the transfer moulding the interposer may be at least partly covered by a mould so as to form a cavity for the insulating material which is to be injected into the cavity. Preferably, the cavity will comprise the opening and additionally comprise a space on said outer side of the opening so as to provide sufficient space to entirely encapsulate the at least one conductor.

A separate opening may be provided, which may be a recess that does not extend through the interposer or may extend through the interposer wherein the insulating material is supplied from a direction so as to pass the region of the separate opening before it reaches the aperture. The separate opening stabilises the transfer moulding process with regard to different aspects. First, the separate opening acts as a reservoir for the electrically insulating material. As a result, there will be sufficient material to fill the aperture when a first amount of material has entered the aperture. Especially if the insulating material is a cohesive material, the material which has already entered the aperture can attract material which is located in the separate opening. Thus, there will be a sufficient flow into the aperture, even if the flow from a material source is temporarily not sufficient. Second, the separate opening acts like a reflection shield, if the insulating material is injected with a velocity which is too high or is injected from a direction which would result in a reverse flow and therefore prevent the succeeding material to enter or fill the aperture. One explanation for this effect is that, first, the insulating material will pass the separate opening and at least a part of the insulating material is stored temporarily in the separate opening. Afterwards, when additional material has arrived, at least a part of the stored material escapes from the separate opening and joins the succeeding material. This results in a flow with satisfactory flux density but with moderate velocity. Apart from that, the temporary storage effect allows the filling of other cavities or spaces with insulating material wherein these additional cavities or spaces may be located on side paths of the material flow.

In a preferred embodiment such additional cavities or spaces to be filled comprise the exterior region of the interposer and/or the microchip devices, especially lateral regions along outer edges of the interposer and/or the microchip device. This allows for encapsulating at least a part of the interposer and/or the microchip device. Preferably, in this case, the separate opening is dimensioned and arranged so that, during the transfer moulding, the insulating material flows along the exterior of the interposer and/or the microchip device before it reaches the aperture.

The cross-section of the separate opening may have any shape, for example the shape of a circle, slot, square or rectangle. Further, the separate opening can be sub-divided and/or a plurality of separate openings can be provided.

Preferably, the separate opening or openings are shaped and located so that the aperture, and preferably also an adjacent part of the same cavity to be filled, is/are filled completely with the insulating material.

Two major advantages of the proposed method of providing the separate opening are that the performing of the transfer moulding and therefore the handling of the interposer and the microchip device are facilitated, since the separate opening stabilises the flow of insulating material, and that, as a result of satisfactory transfer moulding, the final package is protected against damage and can be handled easily.

In a preferred embodiment, there are plural separate apertures or separate aperture regions to be filled with the electrically insulating material, wherein the apertures or regions are aligned in series so as to form a passageway to be passed by the electrically insulating material during the transfer moulding and wherein a further separate opening is arranged in between two of the apertures or regions along the passageway. The further separate opening stabilises the flow of insulating material into the second aperture in a similar way as described above.

In a further preferred embodiment, the aperture forms at least one passageway extending along the outer side of the interposer (i.e. the side from where the aperture extends through the interposer). The passageway allows the insulating material to be supplied to or through the interior of the aperture. In this embodiment, the separate opening is located next to the beginning of the passageway. This location allows for a particularly stable flow into the aperture.

In a further embodiment, there are a plurality of separate openings, each located next to the beginning or to the end of the passageway or of one of plural passageways.

A separate opening next to the end of the passageway also contributes to a complete filling of the aperture or the cavity. One explanation for this is that the material entering that separate opening acts as a reservoir and deflects the succeeding material. Thus, the velocity of the succeeding material at the end of the passageway will be decreased and the deposition of material in that region will be enhanced.)

According to the invention, it is further proposed to provide an interposer for packaging a microchip device comprising:

a plurality of electrical contacts on an outer side of the interposer, for electrically contacting the packaged microchip device and to be electrically connected with the microchip device, an aperture extending from the outer side into the interposer, wherein the aperture is divided into at least two openings by a bridge which connects opposite aperture edges and wherein at least a first of the openings extends from the outer side through the interposer in order to allow connection to the microchip device to be made.

In particular, at least the first opening is a frame or window like opening.

It is further preferred that there are a plurality of the apertures, wherein the apertures are aligned in series so as to form a passageway for allowing the passage of electrically insulating material during a transfer moulding process. An opening which is located in between two of the apertures along the passageway may be provided, wherein the opening extends from the outer side into the interposer.

According to the invention, there is further proposed to provide a packaged microchip device, comprising:

a microchip device having a plurality of first electrical contacts;

an interposer with a plurality of second electrical contacts, with an aperture extending from an outer side through the interposer, wherein the aperture is divided into at least two openings by a bridge; and electrical conductors which electrically connect the first electrical contacts with corresponding ones of the second electrical contacts;

wherein the interposer is attached to the microchip device;

at least one of the conductors extends within the aperture; and the aperture and the separate opening are at least partly filled with an electrically insulating material and thereby the at least one conductor is fixed to the interposer.

In particular, the device may comprise a plurality of packaged microchips wherein the outlines of the microchips each define a package area in which the interposer covers the surface of the corresponding microchip, except for the package area regions of the aperture; and wherein the bridge extends substantially parallel to the microchip surface from the outside of one of the package areas into this package area.

The present invention will now be described by way of non-limitative example only, with reference to the accompanying schematic drawings, in which:

In FIGS. 1 to 8 the same reference numerals are used for parts and features having the same or similar functions.

Figure 1:
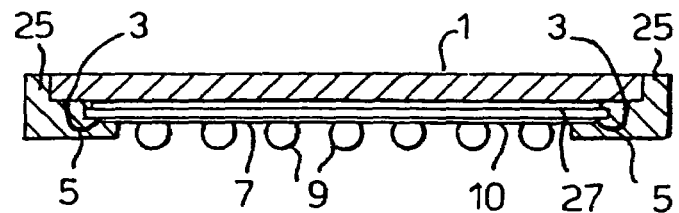
FIG. 1 to 3 show cross-sections through different packaged microchip devices.

FIG. 1 shows a cross-section through an arrangement with a microchip device 1 with an interposer 7 and with encapsulating resin 25. The interposer 7 is fixed to the microchip device 1 with a layer of adhesive 27. The width of the microchip device 1 is greater than the width of the interposer 7 so that the edges of the microchip device 1 project outwards on both sides of the microchip device/interposer arrangement. On the surface of the microchip device 1 which faces to the interposer 7 chip pads 3 are provided where the interposer 7 does not cover the surface. These chip pads 3 act as electrical contacts in order to allow the contact and electrical connection of the microchip device 1 to the interposer 7. There is at least one electrical contact (not shown) on the interposer surface (on the "outer side" 10 of the interposer 7) for each chip pad 3. These contacts are located on the surface of the interposer which faces downwards in FIG. 1. This means that the chip pads 3 and the contacts on the interposer surface are facing towards the same direction. Each chip pad 3 is electrically connected to one of these contacts by a conductor wire 5. Further, each of the contacts is electrically connected with a contact ball 9 on the same interposer surface by an electrical connection (not shown). These electrical connections are parts of the interposer 7. The contact balls 9 act as electrical contacts to allow the electrical connection of the packaged microchip device 1. The conductor wires 5 are encapsulated in the resin 25 which can be provided by any suitable process, especially by potting, dispensing, printing and/or transfer moulding. The resin 25 encapsulates not only the conductor wires 5 but also the edges of the microchip device 1 and of the interposer 7 so as to mechanically stabilise the package and so as to cover and electrically insulate the chip pads 3 as well as the contacts (not shown) on the interposer surface next to the side edges.

Figure 2:
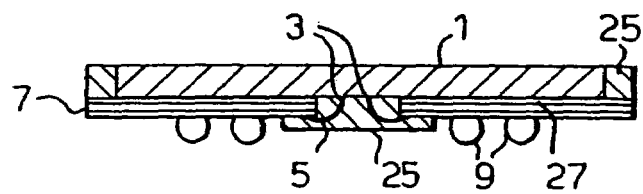

The package design according to FIG. 1 represents a class of CSP (Chip Scale Packaging) which is called fan-in design. The design according to the arrangement shown in FIG. 2 represents another class of CSP, called fan-out design. The fan-in design differs from the fan-out design with regard to the arrangement of the contacts on the surfaces of the microchip device 1 and the interposer 7 which are to be electrically connected by the conductor wires 5 or by other appropriate means. In the fan-in design, both groups of contacts are distributed over the surface areas next to the side edges of the microchip device 1 or the interposer 7. In the fan-out design, these contacts are placed on a surface region of the interposer 7 or the microchip device 1 which are located in the central area of the cross-section. Combinations of the fan-in design and the fan-out design are possible.

Figure 3:
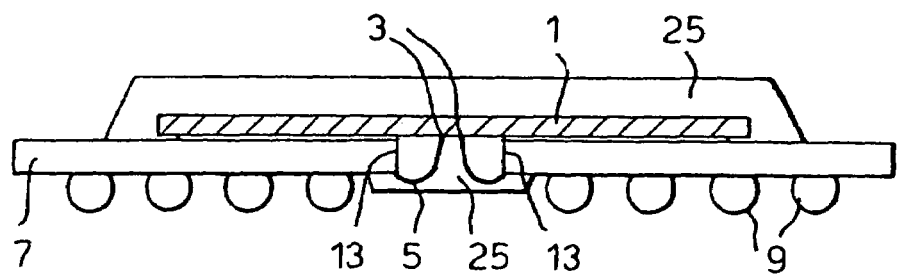

FIG. 3 shows a variant of the fan-out design in which both the side edges and the back surface (facing upwards in FIG. 3) of the microchip device 1 are covered by the resin 25. Therefore, the microchip device 1 is encapsulated by the resin 25. This design results in particularly stable packages. In contrast to this, the resin 25 according to the design of FIG. 2 does not cover the back surface of the microchip device 1. Further, the side edge of the peripheral resin 25 is aligned with the side edge of the interposer 7 in the embodiment of FIG. 2.

The invention is not limited to the designs which have been described with reference to FIG. 1 to 3.

Figure 4:
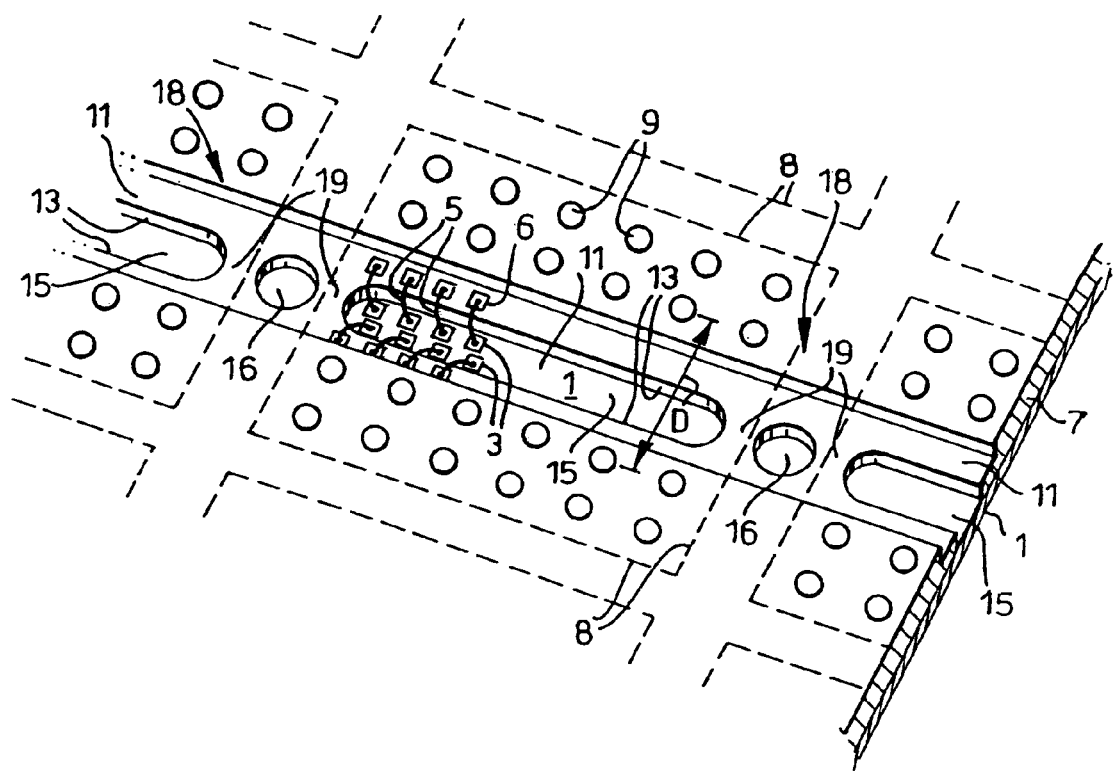
FIG. 4 shows in perspective view a part of an interposer positioned on a plurality of microchip devices.

FIG. 4 shows a perspective view onto an interposer 7 which is located adjacent to a plurality of microchip devices 1 in order to allow the packaging of the these microchip devices 1 at the same time or in parallel in one process. The arrangement according to FIG. 4 comprises at least nine microchip devices 1 to be packaged as indicated by the dotted package outlines 8. The part on the right hand side of the arrangement has been cut off in order to show the profile of the arrangement.

The interposer 7 of the arrangement of FIG. 4 is a single part. This facilitates the handling of the interposer and accelerates the production of a plurality of packages. However, an interposer consisting of a plurality of parts can be used instead. The interposer 7 comprises an aperture 11 with several aperture regions, wherein each aperture region corresponds to the package area of one of the microchip devices 1. There is an elongate first opening 15 in each package area with a cross-section elongate rectangle with rounded corners. The first openings 15 extend from the outer side (the top side in FIG. 4) through the interposer 7 to the surface of the corresponding microchip device 1. As an example for all microchip devices 1 and for other regions on the surface of this particular microchip device 1, eight chip pads 3 are shown on the lefthand side of the package area of the central package in FIG. 4. The interposer 7 is located on the microchip device surface so as to allow the access to the chip pads 3 from the outer side (top side) through the first opening 15. After arranging the interposer 7 adjacent to the microchip devices 1 conductor wires 5, or other appropriate electrical conductor means, are provided and are connected to the chip pads 3 and to corresponding electrical interposer pads 6 so as to electrically connect each one of the chip pads 3 with one of the interposer pads 6. The interposer pads 6 are located on a surface region of the interposer 7 which faces to said outer side. Each one of the interposer pads 6 is electrically connected (connections not shown) to each one of the contact balls 9 on the interposer surface.

In the embodiment shown in FIG. 4, the aperture 11 or the aperture regions are stepped so that the surface regions where the interposer pads 6 are located and the surface regions where the contact balls 9 are located are on different levels. In particular, the level of the interposer pads 6 is lower so that the aperture 11 can be filled up to the level of the surface region of the contact balls 9. However, the invention is not limited to this particular embodiment. Rather, other stepped profiles of the interposer so that there are different surface levels are possible. It is also possible to provide an interposer where the interposer pads or contacts are located on the same surface level as the contact balls or other types of external contacts (as for example shown in the designs according to FIG. 1 to 3).

The different first openings 15 of the aperture regions are separated by a bridge 18 between each two of the first openings 15. Each bridge 18 comprises two tie bar 19 which extend from one side of the aperture 11 to the opposite side so as to connect the opposite aperture edges 13 that extend along the first opening 15. Between the two tie bars 19 of each bridge 18, there is a second opening 16 which extends also from the outer side of the interposer 7 through the interposer 7 to the surface level of the microchip devices 1. In an alternative embodiment at least one of these second openings does not extend through the interposer, but only extends from the outer side into the interposer. In both embodiments the second opening 16 act as stabilising means in order to stabilise the flow of liquid or molten insulating material which is transferred to at least partly fill the aperture 11 or aperture regions. Further, the tie bars 19 act as cross struts for the aperture 11. Therefore, the dimensions of the first openings 15 and the distance D between the contact balls 9 on opposite sides of the aperture 11 are stabilised and the handling of the interposer 7 is facilitated.

The aperture 11 forms a passageway for supplying encapsulating material or filling material to the aperture regions. The passageway is elongate and composed of a series of succeeding aperture regions according to the embodiment of FIG. 4.

Figure 5:
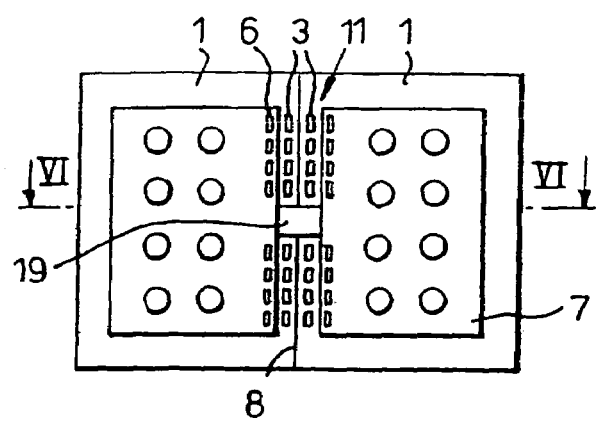
FIG. 5 shows a view onto the contact surface of an interposer which is arranged next to two microchip devices.
Figure 6:
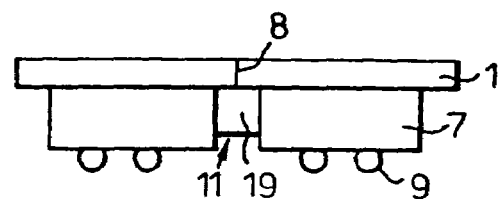
FIG. 6 shows a cross-section along line VI-VI through the arrangement of FIG. 5.

Another embodiment of an interposer/microchip device arrangement is shown in FIGS. 5 and 6. FIG. 5 shows a top view onto the contact surface of the arrangement where the contact balls 9 are located. The interposer 7 consists of a single part and is provided for the packaging of two microchip devices 1. The arrangement is similar to the fan-in design, but the resulting two packages of the microchip devices 1 will be divided after the packaging by separating them along the package outline 8. The aperture 11 is elongate and extends along the edges in the central area of the interposer 7 where the interposer pads 6 are located. The aperture 11 is subdivided by a tie bar 19 which is located half way between the open end of the aperture 11 (at the top and bottom in FIG. 5 and in the front and back in FIG. 6). The tie bar 19 does not extend from the surface level of the microchip device 1 to the surface level on the outer side of the interposer 7 where the contact balls 9 are located (as can be seen best from FIG. 6). Rather, the tie bar 19 extends from the surface level of the microchip device 1 to a level which is at about two thirds of the level difference to the surface level on the outer side of the interposer 7. This allows insulating material or other filling or encapsulating material to pass the tie bar 19 when the material is supplied from one of the open ends of the aperture 11. Further, the region of the aperture 11 at the open end, through which the material is supplied, acts like one of the second openings 16 of the embodiment of FIG. 4, i.e. it stabilises the flow of the material to the aperture region on the other side of the tie bar 19.

Figure 7:
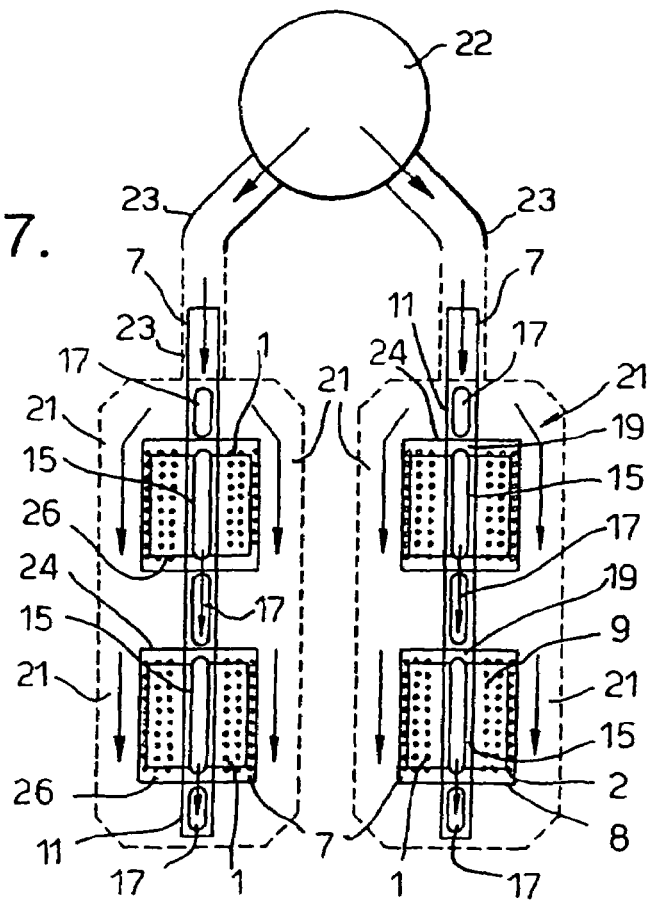
FIG. 7 shows schematically an arrangement for encapsulating material to form microchip packages by transfer moulding.

FIG. 7 shows schematically a process of transfer moulding in order to perform the packaging of four microchip devices 1. Each two of the microchip devices 1 are aligned in series on a supply path of the material to be supplied during the transfer moulding, two on the right hand side and two on the left hand side of FIG. 7. The flow direction of the supplied material is indicated by several arrows in FIG. 7. From a material source 22, the material is supplied through two supply paths 23 each leading to one of the two areas where each two of the microchip devices 1 are aligned in series.

Figure 8:
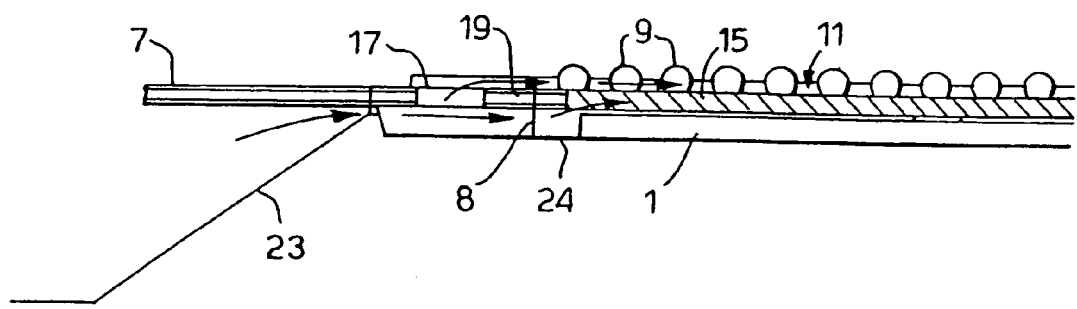
FIG. 8 is a cross-sectional view of a part of the arrangement of FIG. 7.

A sectional view of a part of such an area is shown in FIG. 8 with some details in the region where the supply path 23 ends. The arrangement comprises several cavities to be filled completely with encapsulating material: the aperture 11 which is similarly subdivided as in the embodiment of FIG. 4, but does not have the stepped profile; peripheral cavities 21 on both sides of each package so as to allow the encapsulation of the lateral edges of the packages similar to the embodiment of FIGS. 1 and 2; and front and back side cavities 24, 26 located in the front and back of the packages in the supply direction of the material to be supplied. The front and back side cavities 24, 26 allow for the encapsulation of the front and back sides of the packages. For the transfer moulding process, a mould or moulds (not shown) can be provided which cover at least the surface region of interposers 7 where contact balls 9 are located as external contacts of the packages. Each interposer 7 is elongate and extends from the end region of the supply path 23 through the first and second package area of the two aligned microchip devices. It comprises each one first opening 15 per microchip device package. The first openings 15 extend from the outer side of the interposer 7 through the interposer 7 to the surface of the corresponding microchip device 1. Further, the interposer 7 comprises altogether three separate openings 17 located in supply direction in front of the first microchip device package, in between the two microchip device packages, and behind the second microchip device package. All separate openings 17 extend from the outer side of the interposer 7 through the interposer 7. The separate openings 17 stabilise the flow of material which is supplied from the material source 22 through the supply path 23. Further, the handling and the dimensions of the interposer 7 are stabilised by four tie bars 19 in total, located each between one of the first openings 15 and one of the separate openings 17.

When the material from the material source 22 is supplied through the supply path 23, the material reaches the separate opening 17 which is located next to the end of the supply path 23 before it reaches the first front side cavity 24 and before it reaches the first opening 15. Therefore, the filling material partly fills this separate opening 17 and allow other filling material to reach the peripheral cavities 21 before the first opening 15 is completely filled. Therefore, the peripheral cavities 21 can be provided with sufficient material to encapsulate the microchip device 1 and the interposer 7 on their lateral sides during the transfer moulding process. A similar effect is achieved by the separate opening 17 between the two aligned microchip devices 1. However, it should be noted that the length of this particular separate opening 17 is greater than the length of the separate opening 17 in front of the first microchip device 1 and behind the second microchip device 1. By adapting the length of the separate openings 17 and optionally by adapting also or alternatively the length of the first openings 15 the filling of all cavities 15, 21, 24, 26 to be filled can be controlled to achieve satisfactory filling results.

The invention claimed is:

1. A microchip package comprises:
   a microchip device with a top surface and a bottom surface;
   a plurality of first electrical contacts on said top surface of said microchip device;
   an interposer with a top surface and a bottom surface, wherein said bottom surface of said interposer affixes to said top surface of said microchip device;
   a plurality of second electrical contacts on said top surface of said interposer;
   an aperture having a sidewall defining an opening through said interposer wherein said aperture allows a connection of said plurality of first electrical contacts on said top surface of said microchip device to said plurality of second electrical contacts on said top surface of said interposer; and
   a tie-bar dividing said aperture into a first portion and a second portion wherein said tie-bar is affixed to said sidewall, wherein a depth of said tie-bar in said aperture is substantially two thirds of said depth of said aperture through said interposer.

2. The microchip package according to claim 1, further comprising:

a material encapsulating said connection of said plurality of first electrical contacts on said top surface of said microchip to said plurality of second electrical contacts on said top surface of said interposer in said aperture.

3. The microchip package according to claim 2, wherein said material is an electrically insulating material.

4. The microchip package according to claim 1, wherein said connection of said plurality of first electrical contacts on said top surface of said microchip device to said plurality of second electrical contacts on the top surface of said interposer comprises:

a conductive material.

* * * * *